(12) United States Patent
Tozawa

(10) Patent No.: US 6,512,674 B1
(45) Date of Patent: Jan. 28, 2003

(54) PACKAGE FOR SEMICONDUCTOR DEVICE HAVING RADIATING SUBSTRATE AND RADIATOR FIN

(75) Inventor: Tadayuki Tozawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/618,734

(22) Filed: Jul. 18, 2000

(30) Foreign Application Priority Data

Jul. 26, 1999 (JP) .......................................... 11-210160

(51) Int. Cl.⁷ ................................................. H05K 7/20
(52) U.S. Cl. ........................ 361/704; 361/702; 361/707; 165/80.3; 257/706; 174/52.3
(58) Field of Search ................................. 361/702–704, 361/707, 715, 719, 736, 799; 165/80.2, 80.3, 80.4, 185; 257/706–727, 675, 678, 669; 174/52.3, 52.2, 52.4, 16.3, 254, 255; 372/45, 50, 36

(56) References Cited

U.S. PATENT DOCUMENTS

| | | | | |
|---|---|---|---|---|
| 3,943,556 A | * | 3/1976 | Wilson | ......................... 357/74 |
| 4,329,642 A | * | 5/1982 | Luthi et al. | ............... 324/158 F |
| 4,952,999 A | * | 8/1990 | Robinson et al. | .............. 357/68 |
| 4,994,897 A | * | 2/1991 | Golubic et al. | ................ 357/81 |
| 5,001,547 A | * | 3/1991 | Luigi | ......................... 357/74 |
| 5,901,042 A | * | 5/1999 | Ota et al. | ..................... 361/704 |
| 5,905,634 A | * | 5/1999 | Takeda et al. | .............. 361/704 |
| 6,104,464 A | * | 8/2000 | Adachi et al. | .............. 349/150 |
| 6,204,553 B1 | * | 3/2001 | Liu et al. | .................... 257/676 |
| 6,252,772 B1 | * | 6/2001 | Allen | ......................... 165/80.2 |

FOREIGN PATENT DOCUMENTS

| | | | | | |
|---|---|---|---|---|---|
| FR | 2537342 A | * | 11/1983 | ........... H01L/23/04 |
| GB | 2132015 A | * | 1/1982 | ........... H01L/23/12 |
| JP | 357050456 A | * | 3/1982 | ........... H01L/23/28 |
| JP | 0922933802 A | * | 4/1996 | ........... H01L/23/12 |
| JP | 11260960 A | * | 3/1998 | ........... H01L/21/60 |
| JP | 2001085591 A | * | 8/2000 | ........... H01L/23/28 |

* cited by examiner

Primary Examiner—Darren Schuberg
Assistant Examiner—Michael Datskovsky
(74) Attorney, Agent, or Firm—Foley & Lardner

(57) ABSTRACT

A package according to the present invention includes a radiating substrate, a concave portion for a screw formed on a first side of the radiating substrate, a first groove formed on the first surface between a chip mounting portion and the concave portion of the radiating substrate, and a second groove on a second surface of the radiating substrate opposite to said first surface, thereby eliminating to occur a crack at the radiating substrate.

27 Claims, 5 Drawing Sheets

PACKAGE FOR SEMICONDUCTOR DEVICE HAVING RADIATING SUBSTRATE AND RADIATOR FIN

BACKGROUND OF THE INVENTION

1. Field of the Invention

The present invention relates to a package for a semiconductor device (hereinafter called PKG), particularly relates to PKG having a radiating substrate provided with a chip mounting part for directly mounting a semiconductor chip (hereinafter called a chip).

2. Description of the Related Art

Heretofore, this type of PKG has been formed by brazing a ceramic side wall for airtightly sealing a chip directly mounted on a chip mounting part of a radiating substrate.

FIG. 8 is a schematic plan showing a PKG of related art and FIG. 9 is a schematic sectional view when viewed along a line A8–A8' in FIG. 8. FIG. 10 is a partial sectional view showing a part equivalent to the position of a line C8–C8' in FIG. 8 when a semiconductor device using this PKG is mounted on a radiator fin of an amplifier and others.

Referring to FIGS. 8 to 10, as for this type of PKG 80, a concave portion 86 is provided on each opposite side 88, 89 in a first direction of a radiating substrate 81, for fixing the radiating substrate 81 on a radiator fin 100 by a screw 13. A chip mounting part 82 is provided in the approximately center of the radiating substrate 81 for directly mounting a chip 820. The periphery of the chip mounting part 82 is surrounded by a ceramic side wall 83 brazed on the radiating substrate 81. External leads 87 are led out from the side ends of the radiation substrate 81 in a direction perpendicular to the first direction.

For the semiconductor device, after the chip 820 is mounted on the radiation substrate 81, the chip 820 and a part extended inside the ceramic side wall of the external lead 87 are bonded via a gold wire for example and the upper part of the side wall is airtightly sealed with a ceramic cover 90 for example.

The PKG 80 of the related art is formed by brazing and plating the radiating substrate 81 and the ceramic side wall 83. That is, as materials different in a coefficient of thermal expansion of the radiating substrate 81 made of metal and the ceramic side wall 83 are heated and bonded, convex warpage 91 of a few tens micrometer is formed on the lower side of the radiating substrate 81 as shown in FIG. 9.

Therefore, when the semiconductor device using the conventional type PKG 80 is fixed on the radiator fin 100 by the screw 13 as shown in FIG. 10, stress that levels the warpage 91 on the back is generated. There is a problem that at this time, superficial stress becomes maximum on the boundary of bonding 92 between the ceramic side wall 83 on the surface and the radiating substrate 81 and a crack 93 of the ceramic side wall 83 and an interface crack 94 between the ceramic side wall 83 and the radiating substrate 81 are easily made around the boundary.

SUMMARY OF THE INVENTION

A package according to the present invention includes a radiating substrate, a concave portion for a screw formed on a first side of the radiating substrate, a first groove formed on the first surface between a chip mounting portion and the concave portion of the radiating substrate, and a second groove on a second surface of the radiating substrate opposite to said first surface. Therefore, no crack is made on the ceramic side wall or on the boundary of bonding between the ceramic side wall and the radiating substrate when the PKG is mounted on a radiator fin of an amplifier and others using a screw.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

PKG equivalent to a first embodiment of the invention will be described.

Figure 1:
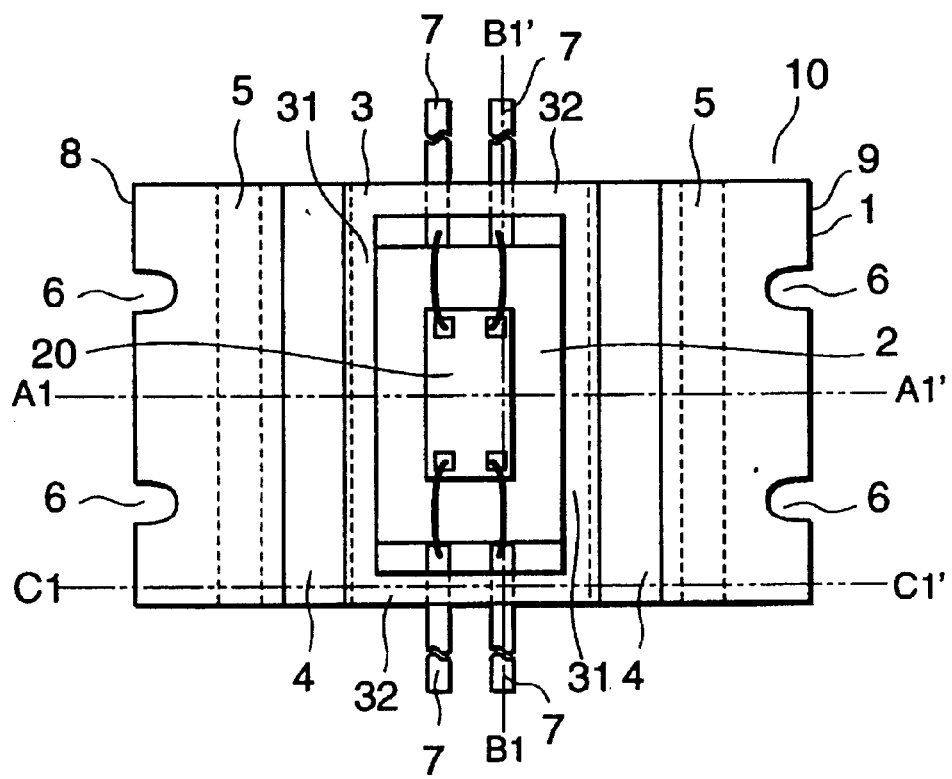
FIG. 1 is a schematic plan showing PKG equivalent to a first embodiment of the present invention.
Figure 2:
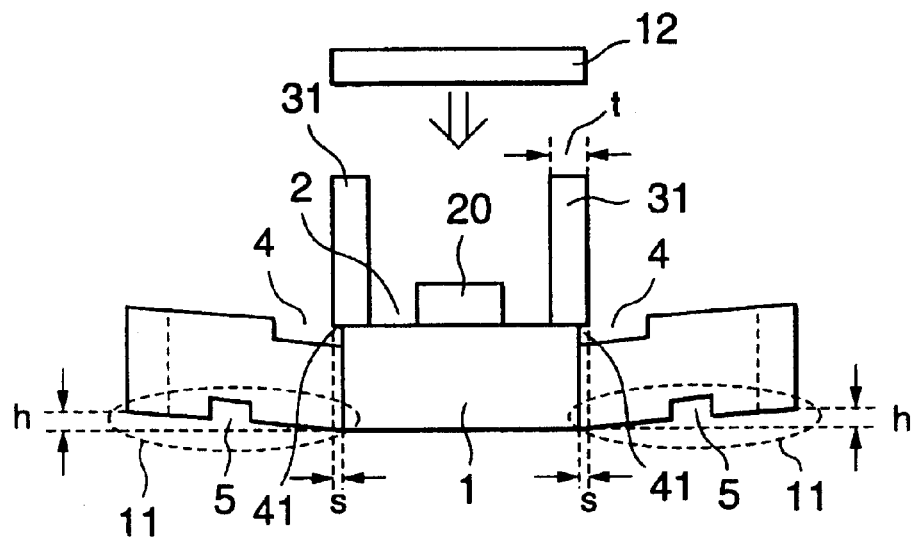
FIG. 2 is a schematic sectional view viewed along a line A1–A1' in FIG. 1.
Figure 3:
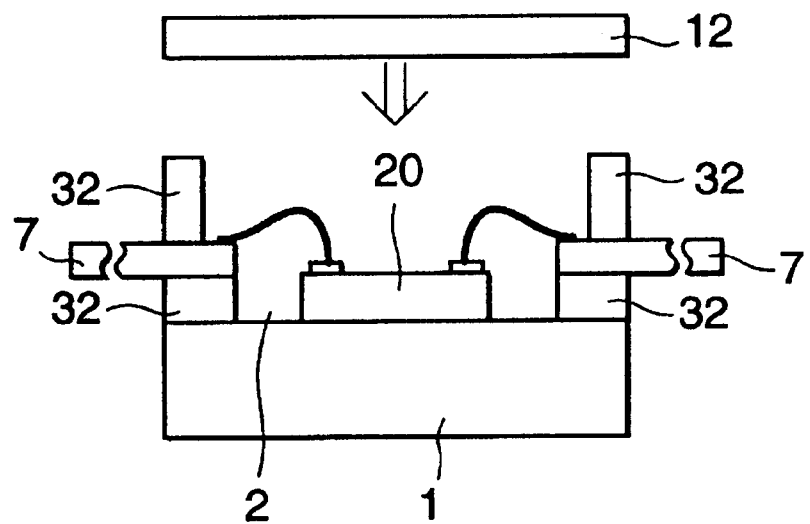
FIG. 3 is a schematic sectional view viewed along a line B1–B1' in FIG. 1.
Figure 4:
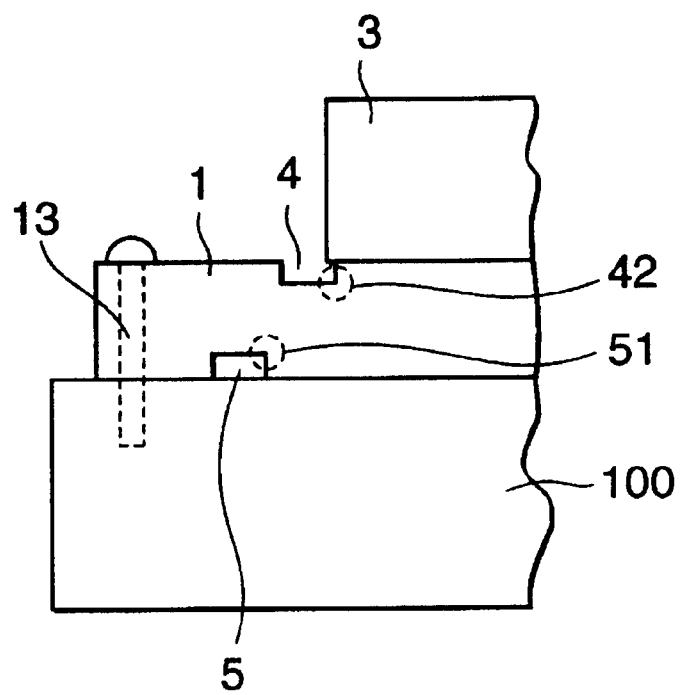
FIG. 4 is a partial sectional view equivalent to the position of a line C1–C1' in FIG. 1 when a semiconductor device using PKG equivalent to the first embodiment is mounted on a radiator fin.

FIGS. 1 to 3 are respectively a schematic plan showing PKG in this embodiment, a schematic sectional view viewed along a line A1–A1' in FIG. 1 and a schematic sectional view viewed along a line B1–B1' in FIG. 1. FIG. 4 is a partial sectional view when a semiconductor device using this PKG is mounted on a radiator fin of an amplifier and others and is equivalent to the position of a line C1–C1' in FIG. 1.

Referring to FIGS. 1 to 4, PKG 10 equivalent to this embodiment is provided with a concave portion 6 that pierces a radiating substrate 1 in the direction of the thickness of the radiating substrate 1 on each of a pair of opposite sides 8 and 9 in a first direction of the radiating substrate 1. The PKG is further provided with a first concave groove 4 that is parallel to the sides 8 and 9 in the first direction and that crosses the radiating substrate 1 on the side of a first surface between a chip mounting part 2 and the concave portion 6. The PKG further has a second concave groove 5 that is parallel to the sides 8 and 9 in the first direction and that crosses the radiating substrate 1 on the side of a second surface opposite to the first surface between the first concave groove 4 and the concave portion 6 on the sides 8 and 9 in the first direction. The first concave groove 4 and the second concave groove 5 are formed so that they are not mutually overlapped.

The chip mounting part 2 is surrounded by a ceramic side wall 3 including a first ceramic side wall 31 approximately parallel to the sides 8 and 9 in the first direction and a second ceramic side wall 32 in a direction perpendicular to the first direction. At this time, a part of the outside of the first ceramic side wall 31 is pushed out over the first concave groove 4 and is equivalent to a part overlapped by s 41.

However, it is desirable that the quantity of overlap s is $0<s \leq 0.4$ because of trade-off between the strength of bonding between the radiating substrate 1 and the ceramic side wall 3 and the inhibition of the formation of a crack on the ceramic side wall 3 in mounting when the thickness of the first ceramic side wall 31 is t.

Next, an outline of a method of manufacturing the PKG 10 will be described.

The chip mounting part 2 is provided in the center of the first surface of the radiating substrate 1 made of metal 25 mm or more wide and 1.5 to 2.5 mm thick such as an alloy of copper and tungsten (Cu—W). Then, the first concave groove 4 0.8 to 1.2 mm wide and 0.2 to 0.6 mm deep is formed so that a part of the outside of the first ceramic side wall 31 arranged later is overlapped with the first concave groove.

Next, the second concave groove 5 as wide and deep as the first concave groove 4 is formed on the second surface opposite to the first surface on the side close to the concave portion 6 without being overlapped with the first concave groove 4.

Next, the ceramic side wall 3 is bonded to the radiating substrate 1 by brazing the ceramic side wall 3 surrounding the chip mounting part 2 so that the outside of the first ceramic side wall 31 is pushed out by s over the first concave groove 4. Then, the radiating substrate 1 is plated to complete the PKG of the present invention. As materials different in a coefficient of thermal expansion of metal and a ceramic are heated and bonded at this time, convex warpage 11 a few tens $\mu$m high in a downward direction is also caused on the side of the second surface of the radiating substrate 1 in the PKG 10 equivalent to this embodiment as in the example of the related type.

As for a semiconductor device using the PKG equivalent to this embodiment, after a chip 20 is mounted on the chip mounting part 2 using an alloy of Au—Sn or Au—Si for example, the chip 20 and a part extended inside the ceramic side wall 3 of an external lead 7 are bonded via a wire made of Au for example and the upper part of the ceramic side wall 3 is airtightly sealed with a ceramic cover.

Next, the mounting of the semiconductor device using the PKG 10 equivalent to this embodiment will be described.

FIG. 4 is a schematic sectional view showing a main part when the semiconductor device using the PKG 10 is fixed on a radiator fin 100 of an amplifier and others using a screw 13 and is equivalent to the position of a line C1–C1' in FIG. 1.

As described above, as the convex warpage 11 in a downward direction is caused on the side of the second surface of the radiating substrate 1, stress that tries to level the warpage 11 is generated when the semiconductor device is fixed on the radiator fin 100 in the position of the concave portion 6 by the screw 13.

However, as in the first concave groove 4 and the second concave groove 5 are provided to the radiating substrate 1 in the PKG 10, the first ceramic side wall 31 is bonded to the radiating substrate so that a part of the outside of the first ceramic side wall 31 is pushed out by the overlap width s over the first concave groove 4, stress generated to level the warpage 11 is dispersed to a corner 42 on the side of the chip mounting part of the first concave groove 4 and a corner 51 on the side of the chip mounting part of the second concave groove 5 and never converges in the vicinity of a location where the ceramic side wall 3 (particularly the first ceramic side wall 31) and the radiating substrate 1 are bonded.

Hereby, a crack is prevented from being made on the ceramic side wall 3 and on an interface between the radiating substrate 1 and the ceramic side wall 3.

Also, as the PKG 10 equivalent to this embodiment is formed so that the first concave groove 4 and the second concave groove 5 have no part mutually overlapped, the maximum points on the surface and on the back of stress that tries to level the warpage of the radiating substrate 1 are apart by approximately 1 mm. Therefore, the stress is applied to the whole without deforming the radiating substrate 1, adhesion between the radiator fin 100 and the radiating substrate 1 becomes more satisfactory and radiation can be also more enhanced.

Next, PKG equivalent to a second embodiment of the invention will be described.

Figure 5:
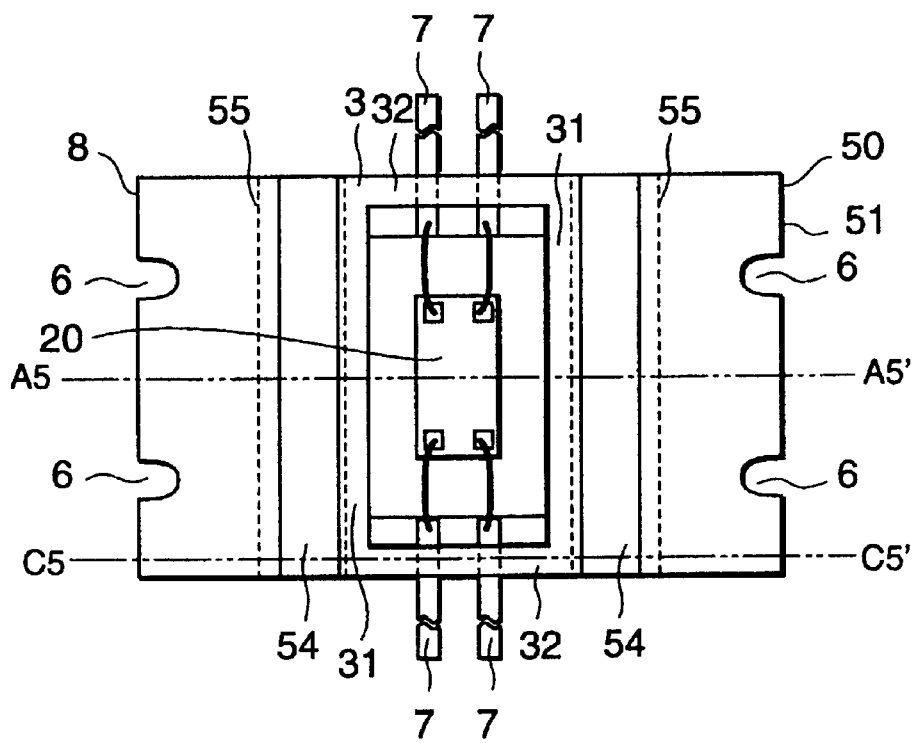
FIG. 5 is a schematic plan showing PKG equivalent to a second embodiment of the present invention.
Figure 6:
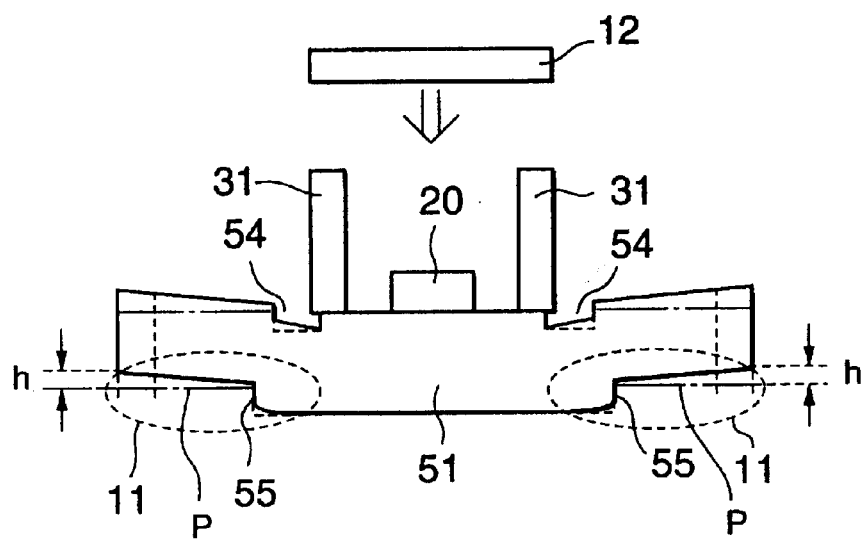
FIG. 6 is a schematic sectional view viewed along a line A5–A5' in FIG. 5.
Figure 7:
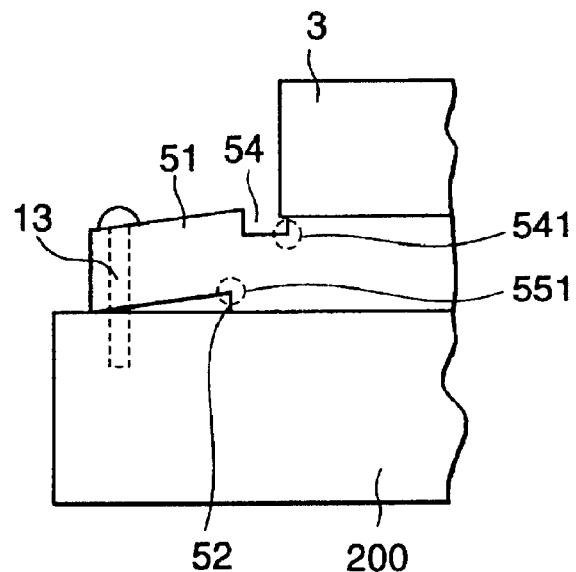
FIG. 7 is a partial sectional view equivalent to the position of a line C5–C5' in FIG. 5 when a semiconductor device using PKG equivalent to the second embodiment is mounted on a radiator. fin.
Figure 8:
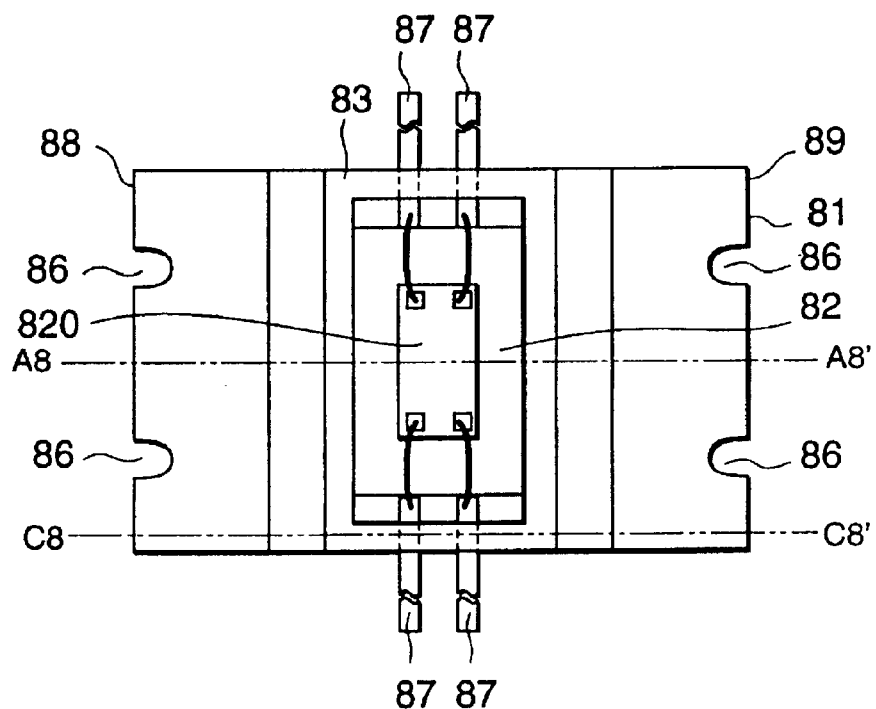
FIG. 8 is a schematic plan showing a PKG of related art.
Figure 9:
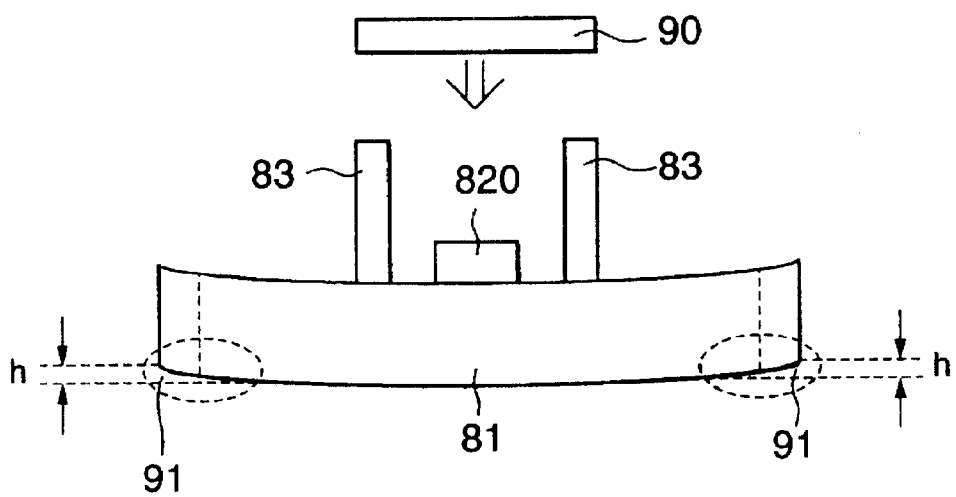
FIG. 9 is a schematic sectional view viewed along a line A8–A8' in FIG. 8.
Figure 10:
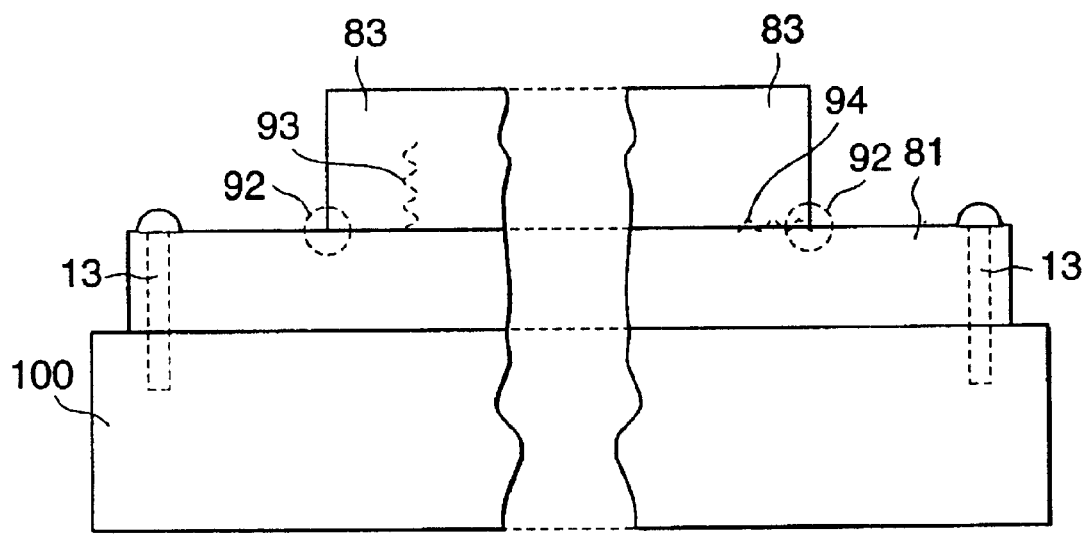
FIG. 10 is a partial sectional view equivalent to the position of a line C8–C8' in FIG. 8 when a semiconductor device using the PKG of the related art is mounted on a radiator fin.

FIGS. 5 and 6 are respectively a schematic plan showing PKG equivalent to this embodiment and a schematic sectional view viewed along a line A5–A5' in FIG. 5. FIG. 7 is a partial sectional view when a semiconductor device using the PKG is mounted on a radiator fin of an amplifier and others and is equivalent to the position of a line C5–C5' in FIG. 5.

As referring to FIGS. 5 to 7, PKG 50 equivalent to this embodiment is different from the PKG 10 equivalent to the first embodiment only in that a second surface including boundaries of difference in a level 55 on the side of a chip mounting part 20 has convex difference in a level, the detailed description is omitted.

The boundary of difference in a level 55 is formed so that it is located between a first concave groove 54 and a concave portion 6.

As a method of manufacturing the PKG 50 equivalent to this embodiment is all similar to the method of manufacturing the PKG 10 equivalent to the first embodiment except that a convex part with difference in a level of 0.2 to 0.6 mm is provided in the position of the boundary of difference in a level 55 on the side of the chip mounting part 20 on the side of the second surface, the description is omitted.

Also, difference in a level according to the difference in a level of the PKG 50 is provided beforehand to a radiator fin 200 of an amplifier and others for mounting a semiconductor device using the PKG 50 equivalent to this embodiment.

Therefore, as convex warpage is caused downward on the side of the second surface of a radiating substrate 51 as in the example of the conventional type when the semiconductor device using the PKG 50 equivalent to this embodiment is fixed on the radiator fin 200 in the position of the concave portion 6 using a screw 13, stress that tries to level the warpage is generated when the semiconductor device is fixed on the radiator fin 200 by the screw 13.

However, as in the PKG 50 equivalent to this embodiment, a first concave groove 54 and a part with difference in a level having boundaries of difference in a level 55 are provided to the radiating substrate 51, stress generated to level the warpage is dispersed to a corner 541 on the side of the chip mounting part of the first concave groove 54 and a corner 551 on the side of the chip mounting part of the boundary of difference in a level 55 and never converges in the vicinity of a location where a ceramic side wall 3 (particularly a first ceramic side wall 31) and the radiating substrate 51 are bonded.

Hereby, a crack is prevented from being made on the ceramic side wall 3 and on an interface between the radiating substrate 51 and the ceramic side wall 3 as in the case of the first embodiment.

Also, as in the PKG 50 equivalent to this embodiment, the part with difference in a level is formed so that the boundary of difference in a level 55 is located between the first concave groove 54 and the concave portion 6, the maximum points on the surface and on the back of stress for leveling the warpage of the radiating substrate 51 are apart by approximately 1 mm. Therefore, it is also similar to the case of the first embodiment that the stress is applied to the whole without deforming the radiating substrate 51, adhesion between the radiator fin 200 and the radiating substrate 51 becomes more satisfactory and radiation can be more enhanced.

The above embodiments are described using the example that the second concave groove or the boundary of difference in a level is formed between the first concave groove and the concave portion on the side in the first direction, however, the invention is not limited to the example and if the first concave groove is closer to the side of the chip mounting part than the position where the second concave groove or the boundary of difference in a level is formed, approximately similar effect is acquired.

Also, metallic material to be a radiating substrate is also not limited to an alloy of Cu—W and it need scarcely be said that composite material such as an alloy of Cu—Mo can be used.

As in the PKG according to the invention, the first concave groove is provided to the first surface of the radiating substrate, the second concave groove or the part with difference in a level the central side of which is convex is provided to the second surface and further, the ceramic side wall is bonded to the radiating substrate so that a part of the ceramic side wall along the first concave groove is pushed out over the first concave groove, effect that stress that levels the warpage caused in mounting of the radiating substrate is dispersed to the corner on the side of the chip mounting part of the first concave, groove and the corner on the side of the chip mounting part of the second concave groove or the corner of the boundary of difference in a level, never converges in the vicinity of the location where the ceramic side wall and the radiating substrate are bonded and the formation of a crack on the ceramic side wall or a crack on an interface between the ceramic side wall and the radiating substrate is inhibited is acquired.

Also, effect that adhesion between the radiator fin and the radiating substrate becomes more satisfactory by forming the first concave groove and the second concave groove so that they have no part mutually overlapped or forming the boundary of difference in a level between the first concave groove and the concave portion in the first direction and radiation can be more enhanced is acquired.

While this invention has been described in connection with certain preferred embodiment, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A package comprising:
    a radiating substrate having a first surface and a second surface opposite from each other, said radiating substrate having a first groove formed on said first surface, said radiating substrate further having a second groove formed on said second surface of said radiating substrate and parallel with said first groove; and
    a semiconductor chip on a portion of said first surface.

2. The package as claimed in claim 1, wherein said first groove and said second groove pass through opposite sides of said radiating substrate in a first direction.

3. The package as claimed in claim 2, wherein said first groove does not overlap with said second groove.

4. The package as claimed in claim 3, said package further comprising a concave portion which passes through said first surface and said second surface on at least one of opposite sides of said radiating substrate in a second direction perpendicular to said first direction.

5. A package comprising:
    a radiating substrate having first and second surfaces opposite from one another, said radiating substrate having first opposite sides in a first direction and second opposite sides in a second direction perpendicular to said first direction;
    said radiating substrate having a pair of first grooves each formed on said first surface of said radiating substrate;
    said radiating substrate having a pair of second grooves each formed on said second surface of said radiating substrate; and
    a semiconductor chip formed on a substantial center portion of said surface of said radiating substrate.

6. The package as claimed in claim 5, wherein said first grooves pass through said first opposite sides of said radiating substrate and said second grooves pass through said second opposite sides of said radiating substrate.

7. The package as claimed in claim 6, wherein said center potion is defined by said pair of said first grooves.

8. The package as claimed in claim 7, said package further comprising:
    a side wall is formed at said center portion on said first surface of said radiating substrate to surround said semiconductor chip so that said side wall overlaps with said first grooves.

9. The package as claimed in claim 8, wherein the distance between each said second groove and a corresponding one of said second opposite sides is closer than the distance between each said first groove and a corresponding one of said second opposite sides.

10. The package as claimed in claim 9, wherein said center portion does not include said first grooves.

11. The package as claimed in claim 10, said package further comprising an external lead extending from said substrate in said first direction.

12. A package comprising:
    a radiating substrate having a first surface and a second surface opposite to said first surface, said radiating substrate having a first opposite sides in a first direction and a second opposite sides in a second direction perpendicular to said first direction;
    a pair of concave portions each formed on a corresponding one of said second opposite sides of said radiating substrate;
    a ceramic wall formed on said first surface to define a chip mounting portion;

a radiator fin which is fixed by screws through said pair of said concave portions to said radiating substrate; and a groove portion formed on said radiating substrate to prevent a crack from occurring on at least one of said ceramic side wall and a contacting boundary between said ceramic side wall and said radiating substrate.

13. The package as claimed in claim 12, wherein said groove portion has a pair of first grooves each formed on said first surface of said radiating substrate and passing through said first opposite sides on said radiating substrate.

14. The package as claimed in claim 13, said groove portion has a pair of second grooves each formed on said second surface of said radiating substrate and passing through said first opposite sides on said radiating substrate.

15. The package as claimed in claim 14, wherein said ceramic side wall overlaps with said first grooves.

16. The package as claimed in claim 15, wherein the distance between each said second groove and a corresponding one of said second opposite sides is closer than the distance between each said first groove and a corresponding one of said second opposite sides.

17. The package as claimed in claim 16, wherein a semiconductor chip is formed on said chip mounting portion so that said ceramic side wall is arranged between said semiconductor chip and said first grooves.

18. The package as claimed in claim 17, said package further comprising external leads led out from the sides in said first direction.

19. A package comprising:

a radiating substrate having a first surface and a second surface opposite from each other, said radiating substrate having a first groove formed on said first surface and a second groove formed on said second surface parallel with said first groove; and a semiconductor chip on a portion of said first surface, wherein said first groove passes through opposite sides of said radiating substrate in a first direction.

20. The package as claimed in claim 19, wherein said first groove does not overlap with said second groove.

21. The package as claimed in claim 20, further comprising a concave portion that passes through said first surface and said second surface on at least one of opposite sides of said radiating substrate in a second direction perpendicular to said first direction.

22. A package comprising:

a radising substrate having first and second surfaces opposite from one another, said radiating substrate having first opposite sides in a first direction and second opposite sides in a second direction perpendicular to said first direction;

said radiating substrate having a pair of first grooves formed on said first surface of said radiating substrate and passing through said first opposite sides of said radiating substrate;

said radiating substrate having a pair of second grooves formed on said second surface of said radiating substrate and passing through said first opposite sides of said radiating substrate; and a semiconductor chip formed on a substantial center portion of said surface of said radiating substrate.

23. The package as claimed in claim 22, wherein said center potion is defined by said pair of said first grooves.

24. The package as claimed in claim 23, said package further comprising a side wall formed at said center portion on said first surface of said radiating substrate to surround said semiconductor chip so that said side wall overlaps with said first grooves.

25. The package as claimed in claim 24, wherein a distance between each of said second grooves and a corresponding one of said second opposite sides is closer than the distance between each of said first grooves and a corresponding one of said second opposite sides.

26. The package as claimed in claim 25, wherein said center portion does not include said first grooves.

27. The package as claimed in claim 26, said package further comprising an external lead extending from said substrate in said first direction.

* * * * *